United States Patent [19]

Naito

[11] Patent Number: 4,636,745
[45] Date of Patent: Jan. 13, 1987

[54] SIGNAL WAVEFORM EQUALIZING CIRCUITRY

[75] Inventor: Ryuichi Naito, Tokorozawa, Japan

[73] Assignee: Pioneer Electronic Corporation, Tokyo, Japan

[21] Appl. No.: 674,666

[22] Filed: Nov. 26, 1984

[30] Foreign Application Priority Data

Nov. 24, 1983 [JP] Japan ................................ 58-221227

[51] Int. Cl.$^4$ ............................................. H03F 3/191
[52] U.S. Cl. ..................................... 330/304; 330/311
[58] Field of Search ............... 330/302, 303, 304, 305, 330/306, 311

[56] References Cited

U.S. PATENT DOCUMENTS 4,119,923  10/1978  Legendre et al. ............... 330/311 X Primary Examiner—Eugene R. LaRoche
Assistant Examiner—Steven J. Mottola
Attorney, Agent, or Firm—Fleit, Jacobson, Cohn & Price

[57] ABSTRACT

A signal waveform equalizing circuitry for compensating for the distortion of a signal picked up from a magnetic recording medium by means of a magnetic head, including a first network having the transfer function of $(1-BS)$ and a second network made up of passive elements having the transfer function of a multiplication of the transfer function $(1+AS)$ and the transfer function having the integration function, wherein said first and second networks are serially connected. Thus, the circuitry having an overall transfer function which is a multiplication of transfer functions expressed by $(1+AS)$ and $(1-BS)$ respectively (A, B being a constant, and S being $j\omega$ while $\omega$ is angular frequency) and a transfer function having an integration function is realized using relatively simple circuit configuration.

4 Claims, 6 Drawing Figures

SIGNAL WAVEFORM EQUALIZING CIRCUITRY

BACKGROUND OF THE INVENTION

1. Field of the Invention

The present invention relates to a signal waveform equalizing circuitry, and more specifically to a circuitry for equalizing a playback signal from a magnetic head which is used for picking up signals recorded in a magnetic recording medium.

2. Description of Background Information

Generally, a signal produced by a magnetic head used for picking up signals recorded on a magnetic recording medium suffers from various distortions caused due to the derivative function inherent in the magnetic head, high frequency roll off and poor phase characteristic of the magnetic head.

To compensate for the distortions of the playback signal caused by the above characteristics of the magnetic head, a technique is disclosed in the U.S. Defensive Publications T 943,004. In this technique, a plurality of networks each having a particular transfer function are provided so as to compensate for the distortion of the waveform of the playback signal from a magnetic head. However, a drawback of this conventional circuitry is that the circuit construction is complicated because the it is made up of a plurality of independent networks each having a specific transfer function.

SUMMARY OF THE INVENTION

An object of the invention is to alleviate the problem of the conventional signal waveform equalization circuitry and to provide a signal wavefrom equalization circuitry having a relative simple construction, and hence its cost is reduced.

According to the present invention, a signal waveform equalization circuitry comprises a first network having a transfer function $(1-BS)$ and a second network made up of passive elements, having a transfer function which is a multiplication between a transfer function $(1+AS)$ and a transfer function having an integration function. The first and the second networks are serially connected and the circuitry exhibit an overall transfer function which is a multiplication of the transfer functions which are expressed by $(1-BS)$ and $(1+AS)$, and a transfer function which is an integration function.

The scope and applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention are apparent to those skilled in the art given this detailed description.

DETAILED DESCRIPTION OF THE PREFERRED EMBODIMENTS

Figure 1:
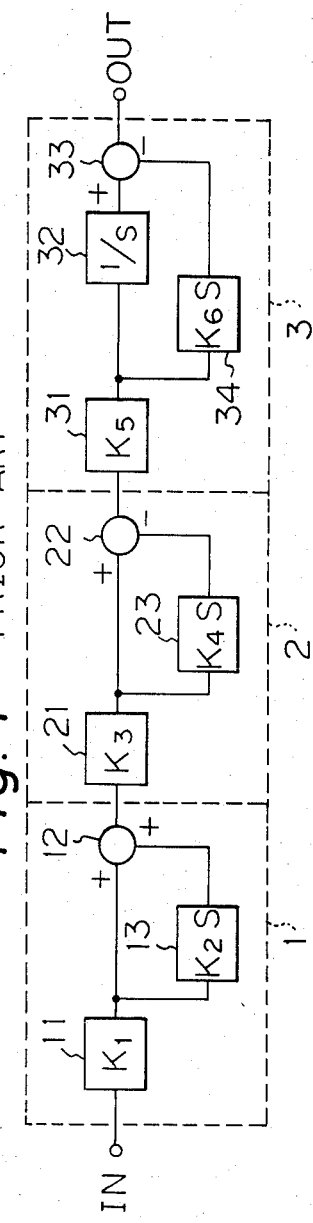
FIG. 1 is a functional block diagram of an example of conventional signal waveform equalization circuit.

Before entering into an explanation of the preferred embodiment of the signal waveform equalizing circuitry of the present invention, reference is first made to FIG. 1 in which the circuitry described in the aforementioned publication is illustrated.

As shown, this ciruicity is made up of three networks which are serially connected. A first network 1 includes an amplifier 11 having a predetermined constant gain $K_1$, an adder 12, and a circuit 13 having a transfer function $K_2S$ ($K_2$ being a constant, S being $j\omega$ wherein $\omega$ is an angular frequency). A second network 2 includes an amplifier 21 having a constant gain $K_3$, a subtractor 22, and a circuit 23 having a transfer function $K_4S$ ($K_4$ being a constant). A third network 3 includes an amplifier 31 having a gain $K_5$, a circuit 32 having a transfer function $1/S$, a subtractor 33, and a circuit 34 having a transfer function $K_6S$ ($K_6$ being a constant).

A total transfer function of the network 1 is expressed as $(1+AS)$ (A being a constant). Similarly, the total transfer functions of the networks 2 and 3 are expressed as $(1-BS)$ and $(1/S-K_6S)$ respectively. The purpose of the networks 1 and 2 provide so called pulse slimming in which the transfer functions $(1+AS)$ and $(1-BS)$ are used to compensate for signal characteristics of the leading edge and the trailing edge of the playback signal which are produced as a result of a high frequency roll off (level drop of the high frequency range) and the phase change of the output signal of the magnetic head. On the other hand, the purpose of the third network is to compensate for the differential characteristic of the magnetic head by means of the transfer function $(1/S-K_6S)$ of the third network.

It is to be noted that the transfer function $(1/S-K_6S)$ of the third network 3 is not essentially different from the transfer function $1/S$ in the case of the complete integration or the transfer function $1/(1+CS)$ in the case of the incomplete integration.

As mentioned before, a problem of the conventional signal waveform equalizing circuitry explained above is that the construction of the circuitry is complicated because the transfer functions $(1+AS)$, $(1-BS)$, and $(1/S-K_6S)$ are respectively provided by independent networks 1 through 3.

A first embodiment of the signal waveform equalizing circuitry will be explained hereinafter with reference to FIGS. 2 through 4 of the accompanying drawings.

Figure 2:
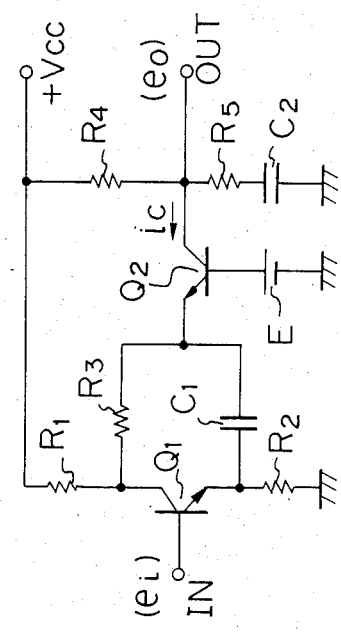
FIG. 2 is a circut diagram of a first embodiment of the signal waveform equalizing circuit according to the present invention.

FIG. 2 is a circuit diagram of the first embodiment of the present invention, in which an input signal $e_i$ to be treated is applied to a base of an NPN transistor $Q_1$. A collector resistor $R_1$ and emitter resistor $R_2$ are respectivcely connected to the collector and the emitter of the transistor $Q_1$. Signals appear at the collector and the emitter of the transistor $Q_1$ are then applied to an emitter of a base-grounded NPN transistor $Q_2$ via a resistor $R_3$ and a capacitor $C_2$ respectively. A bias potential E is connected to the base of the transistor $Q_2$ and the collector thereof is connected to an impedance circuit which is made up of passive elements i.e., resistor $R_4$ and $R_5$ and a capacitor $C_2$. The resistor $R_4$ is also used to supply a bias voltage to the transistor $Q_2$.

Assume that the collector current of the transistor $Q_2$ is $i_c$, the relation between the input signal $e_i$ and this current $i_c$ will be expressed by the following equation (1) because the base of the transistor $Q_2$ is grounded with respect to the alternating current.

$$i_c/e_i = \{R_2/R_1(R_2+R_3)\}(1-SC_1 \cdot R_1R_3/R_2) \quad (1)$$

If $R_1 = R_2$, then equation (1) will be rewritten:

$$i_c/e_i = (1-SC_1R_3)/(R_2+R_3) \quad (2)$$

This means that the input voltage is transferred to a current $1-BS$ where $B=C_1R_3$. In addition, in this abridgement, $1/(R_2+R_3)$ of equation (2) is omitted since it is a constant, and therefore does not have any influence upon the frequency characteristics.

The impedance of the passive elements, that is, resistor $R_4$ and $R_5$ and a capacitor $C_2$ will be then discussed. This passive circuit can be expressed by an equivalent circuit of FIG. 3 with respect to the alternating current. Therefore, the impedance Z across the terminal X, Y shown in FIG. 3 will be expressed by the following equation (3).

$$Z = (1+SC_2R_5)R_4/\{1SC_2(R_4+R_5)\} \quad (3)$$

Since, the voltage $e_0$ appearing at the collector of the transistor $Q_2$ will become equal to $i_cZ$ ($e_0=i_cZ$), the following equation (4) will be obtained from equations (2) and (3).

$$e_0 = \{e_i(1-SC_1R_3)/(R_2+R_3)\} \cdot [(1+SC_2R_5)R_4/\{1+SC_2(R_4+R_5)\}] \quad (4)$$

Therefore, the overall transfer function from the input ($e_i$) to the output ($e_0$) will be expressed by the following equation (5).

$$e_0/e_i = \{R_4/(R_2+R_3)\} \cdot (1-SC_1R_3)(1+SC_2R_5)/\{1+SC_2(R_4+R_5)\} \quad (5)$$

If $C_1R$, $C_2R_5$, $C_2(R_4+R_5)$, and $R_4/(R_2+R_3)$ are expressed by B, A, C, and K respectively ($C_1R=B$, $C_2R_5=A$, $C_2(R_4+R_5)=C$, and $R_4/(R_2+R_3)=K$), then equation (5) will be rewritten as the following equation (6).

$$e_0/e_i = K(1-BS)(1+AS)/(1+CS) \quad (6)$$

Figure 3:
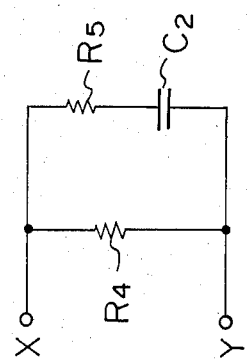
FIG. 3 is an equivalent circuit diagram corresponding to the circuit of FIG. 2.

As will be appreciated from the above equation (6), the circuitry of FIG. 3 has a signal transmission characteristics which is the same as that of the circuitry of FIG. 1.

Figure 4:
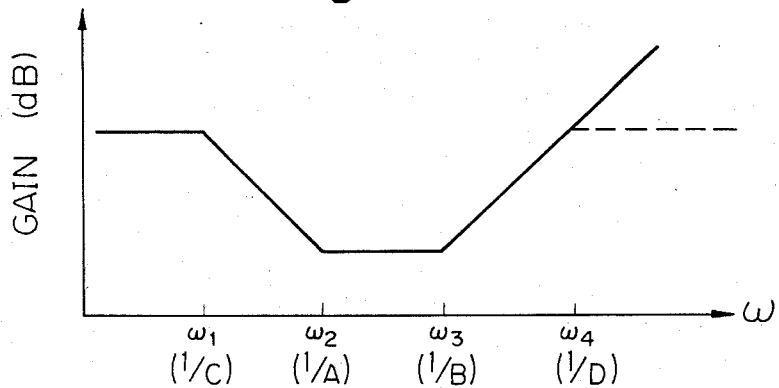
FIG. 4 is a diagram showing a gain characteristics with respect to the frequency of the signal.

FIG. 4 shows a gain characteristic curve with respect to the angular frequency in the case of the transfer function of equation (6). In the figure, the relative position of $\omega_2$ and $\omega_3$ may be reversed depending on the relation between the magnitude of the values A and B. As shown in the figure, the gain increases at a rate of 6 db/OCT for a frequency range higher than $\omega_3$. Therefore, it may be disadvantage that high frequency noise is emphasized in the arrangement of FIG. 2.

Figure 5:
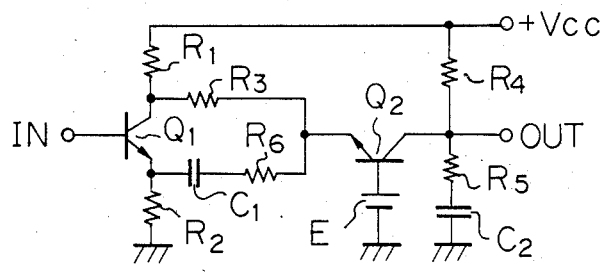
FIGS. 5 and 6 are circuit diagrams showing the other embodiments of the signal waveform equalizing circuitry according to the present invention.

Since the spectrum level of the signal $e_i$ from the signal source (magnetic head) generally decreases as the frequency becomes higher, the gain characteristics may be modified as shown by the dashed line of FIG. 4 so that the gain is maintained constant for a frequency range higher than the angular frequency $\omega_4$. In the case of this modification, the high frequency noise can be attenuated, while causing almost no influence upon the input signal. FIG. 5 shows an example of a configuration of the circuitry which provides the above explained characteristics. The difference between the configuration of this circuitry and the configuration of the circuitry of FIG. 2, is that the impedance circuit which connects the emitter of the transistor $Q_1$ and the emitter of the transistor $Q_2$ are in the form of a series circuit of a capacitor $C_1$ and a resistor $R_6$. Since the other portions of this circuitry are the same as those of the circuitry of FIG. 2, the explanation thereof are omitted.

If $R_1 = R_2$, then the relation between $e_i$ and $i_c$ of this circuitry will be expressed by the following equation (7).

$$i_c/e_i = \{1/(R_2+R_3)\} \cdot \{1-SC_1(R_3-R_0)/(1+SC_1R_0)\} \quad (7)$$

As will be appreciated by comparison between this equation (7) and the equation (2), the equation (7) is essentially the same as equation (2), except the term $1+DS$ of the denominator. By the term $1+DS$, the gain characteristic above the frequency $\omega_4=1/D$ is made constant as shown by the dashed line of FIG. 4.

Figure 6:
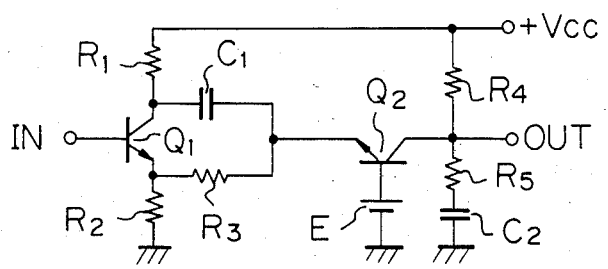

FIG. 6 shows another embodiment of the signal waveform equalizing circuitry according to the present invention, which is also aimed for improving the noise to signal (S/N) characteristics again by the constant gain characteristics for the frequency range above $\omega_4=1/D$. As compared with the construction of the circuitry of FIG. 2, this circuit features a reversal of the position of the resistor $R_3$ and the capacitor $C_1$ but the configuration of the other portions thereof are identical with respect to that of the circuitry of FIG. 2.

Also in this circuitry, if $R_1=R_2$, the following equation (8) will be obtained.

$$c_c/e_i = (1/R_3)\{(1-SC_1R_3)/(1+SC_1R_2)\} \quad (8)$$

As seen from the above, equation (8) is characterized by the term $1+DS$ ($D=C_1R_2$) in the denominator.

It will be appreciated from the foregoing, according to the present invention, the circuit construction of the signal waveform equalizing circuitry is much simplified and a low cost signal waveform equalizing circuitry is presented. This is because a network of the transfer function ($1-BS$) for the pulse slimming is realized by the voltage to current conversion circuit, and the network of the transfer function $(1+AS)/(1+CS)$ for the pulse slimming and integration are provided as an impedance circuit made up of passive elements.

What is claimed is:

1. A signal waveform equalizing circuit having an overall transfer function which is a multiplication of transfer functions expressed by $(1+AS)$ and $(1-BS)$ respectively (A, B are constants, and S is equal to $j\omega$ wherein $\omega$ is an angular frequency) and a transfer function having an integration function, comprising:
   a first network having the transfer function of $(1-BS)$, which includes a first transistor having a first base for receiving an input signal, a first collector, and a first emitter, a resistor connected to said first collector, a capacitor connected to said first emitter, and a second transistor of common base circuit configuration having a second emitter for receiving signals supplied through both said resistor and said capacitor; and a second network made up of passive elements having the transfer function of a multiplication of the transfer function (1+AS) and the transfer function having the integration function, wherein said first and second networks are serially connected.

2. A circuit as set forth in claim 1, wherein said first network takes the form of a circuit having voltage-current conversion function.

3. A signal waveform equalizing circuit having an overall transfer function which is a multiplication of transfer functions expressed by (1+AS) and (1−BS) respectively, (A, B are constants, and S is equal to jω where ω is an angular frequency) and a transfer function having an integration function, comprising:

a first network having the transfer function of (1−BS), which includes a first transistor having a first base for receiving an input signal, a first collector, and a first emitter, a resistor connected to said first emitter, a capacitor connected to said first collector, and a second transistor of common base circuit configuration having a second emitter for receiving signals supplied through both said resistor and said capacitor; and a second network made up of passive elements having the transfer function of a multiplication of the transfer function (1+AS) and the transfer function having the integration function, wherein said first and second networks are serially connected.

4. A circuit as set forth in claim 3, wherein said first network takes the form of a circuit having voltage-current conversion function.

* * * * *